(12) United States Patent
Bao et al.

(10) Patent No.: US 9,070,881 B2
(45) Date of Patent: Jun. 30, 2015

(54) METHOD OF MANUFACTURING AN ORGANIC SEMICONDUCTOR THIN FILM

(71) Applicant: Samsung Electronics Co., Ltd., Suwon-si, Gyeonggi-Do (KR)

(72) Inventors: Zhenan Bao, Stanford, CA (US); Gaurav Giri, Stanford, CA (US); Sang-yoon Lee, Seoul (KR); Stefan Mannsfeld, Palo Alto, CA (US)

(73) Assignees: Samsung Electronics Co., LTD., Suwon-Si (KR); The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 14/281,380

(22) Filed: May 19, 2014

(65) Prior Publication Data
US 2014/0256085 A1 Sep. 11, 2014

Related U.S. Application Data

(63) Continuation of application No. 13/633,640, filed on Oct. 2, 2012.

(51) Int. Cl.
*H01L 51/00* (2006.01)
*H01L 21/02* (2006.01)

(52) U.S. Cl.
CPC ...... *H01L 51/0014* (2013.01); *H01L 21/02282* (2013.01); *H01L 51/0007* (2013.01); *H01L 51/0003* (2013.01); *H01L 51/0012* (2013.01); *H01L 51/0028* (2013.01)

(58) Field of Classification Search
CPC ............ H01L 21/02109; H01L 21/02225; H01L 21/02227; H01L 21/0226
USPC .............. 438/496, 497, 500; 257/E21.299, 257/E21.317, E21.37, E21.4
See application file for complete search history.

(56) References Cited

U.S. PATENT DOCUMENTS

| 7,855,121 B2 | 12/2010 | Kim et al. |
| 2006/0013956 A1 | 1/2006 | Angelescu et al. |
| 2007/0096223 A1 | 5/2007 | Chidambarrao et al. |

FOREIGN PATENT DOCUMENTS

| JP | 2007-123896 A | 5/2007 |
| KR | 20100095748 A | 9/2010 |

OTHER PUBLICATIONS

Giri, Gaurav et al. "Tuning Charge Transport in Solution-Sheared Organic Semiconductors Using Lattice Strain" Letter. 504/Nature/vol. 480 22/29 Dec. 2011. doi:10.1038/nature10683.

Lee, Wen-Ya et al. "High-Mobility Air-Stable Solution-Shear-Processed n-Channel Organic Transistors Based on Core-Chlorinated Naphthalene Diimides" for Adv. Funct. Mater., DOI: 10.102/adfm. 201101606.

(Continued)

*Primary Examiner* — Cheung Lee
(74) *Attorney, Agent, or Firm* — Harness, Dickey & Pierce

(57) ABSTRACT

A method of manufacturing an organic semiconductor thin film includes coating an organic semiconductor solution on a substrate, and shearing the organic semiconductor solution in a direction that results in a shearing stress being applied to the organic semiconductor solution to form the organic semiconductor thin film, wherein a speed of the shearing is controlled such that an intermolecular distance of the organic semiconductor solution is adjusted.

16 Claims, 20 Drawing Sheets

(56) References Cited

OTHER PUBLICATIONS

Kushida, et al., "Mobility enhancement in solution-processable organic transistors through polymer chain alignment by roll-transfer printing," Organic Electronics, vol. 12, pp. 2140-2143 (2011).

Lee, et al., "Control of mesoscale and nanoscale ordering of organic semiconductors at the gate dielectric/semiconductor interface for organic transistors," J. Mater. Chem., vol. 20, pp. 2549-2561 (2010).

Nagamatsu, et al., "Backbone Arrangement in 'Friction-Transferred' Regioregular Poly(3- alkylthiophene)s," *Macromolecules*, vol. 36, pp. 5252-5257 (2003).

Lee, et al., "High-Mobility Air-Stable Solution-Shear-Processed n-Channel Organic Transistors Based on Core-Chlorinated Naphthalene Diimides," *Adv. Funct. Mater.*, vol. 21, pp. 4173-4181 (2011).

FIG. 19

| Speed (mm/s) | Devices | Mobility | | | | On/Off Ratio | | Threshold Voltage | | Max. Current | |
|---|---|---|---|---|---|---|---|---|---|---|---|
| | | Maximum (cm²/Vs) | Average (cm²/Vs) | St. Dev. (cm²/Vs) | SEM (cm²/Vs) | Average | St. Dev. | Average (V) | St. Dev. (V) | Average (A) | St. Dev. (A) |
| 0 | 8 | 0.07 | 0.05 | 0.02 | 0.01 | 7.1E+03 | 8.5E+03 | 29.0 | 10.7 | 3.28E-05 | 1.91E-05 |
| 0.05 | 11 | 0.59 | 0.21 | 0.18 | 0.06 | 6.2E+04 | 1.5E+05 | 28.2 | 11.5 | 2.01E-04 | 2.01E-04 |
| 0.2 | 14 | 0.36 | 0.21 | 0.09 | 0.02 | 6.5E+03 | 1.0E+04 | 39.1 | 5.7 | 2.05E-04 | 9.81E-05 |
| 0.4 | 48 | 0.82 | 0.33 | 0.22 | 0.03 | 1.8E+04 | 2.8E+04 | 39.3 | 7.1 | 2.65E-04 | 1.57E-04 |
| 0.8 | 26 | 1.72 | 0.87 | 0.40 | 0.08 | 9.4E+03 | 7.8E+03 | 42.0 | 5.0 | 3.80E-04 | 1.86E-04 |
| 1.6 | 53 | 1.94 | 0.78 | 0.40 | 0.05 | 2.1E+05 | 3.2E+05 | 30.2 | 14.0 | 5.36E-04 | 4.45E-04 |
| 2.4 | 34 | 2.79 | 1.84 | 0.40 | 0.07 | 6.8E+06 | 6.4E+06 | -14.2 | 17.8 | 4.81E-04 | 1.52E-04 |
| 2.6 | 23 | 3.39 | 2.16 | 0.68 | 0.14 | 9.1E+06 | 1.3E+07 | -2.1 | 17.5 | 4.84E-04 | 1.10E-04 |
| 2.8 | 84 | 4.59 | 1.49 | 0.90 | 0.10 | 8.2E+06 | 5.5E+06 | -16.5 | 17.7 | 3.04E-04 | 1.26E-04 |
| 3.6 | 7 | 2.02 | 1.27 | 0.41 | 0.15 | 1.2E+07 | 1.8E+06 | -12.4 | 10.0 | 2.69E-04 | 4.37E-05 |
| 4 | 58 | 2.79 | 0.81 | 0.60 | 0.08 | 1.0E+07 | 9.2E+06 | -27.4 | 16.2 | 2.48E-04 | 1.97E-04 |
| 8 | 51 | 1.21 | 0.47 | 0.29 | 0.04 | 1.2E+07 | 1.1E+07 | -35.7 | 18.1 | 1.39E-04 | 6.12E-05 |

METHOD OF MANUFACTURING AN ORGANIC SEMICONDUCTOR THIN FILM

PRIORITY STATEMENT

This application is a continuation application of U.S. application Ser. No. 13/633,640, filed on Oct. 2, 2012, the entire contents of which are incorporated herein by reference.

BACKGROUND

1. Field

Example embodiments relate to a method of manufacturing an organic thin film, particularly to a method of manufacturing an organic semiconductor thin film.

2. Description of the Related Art

An organic semiconductor thin film is used as a channel layer of an organic thin film transistor, for example. The organic semiconductor thin film may be formed by various methods (e.g., spin-coating, drop-casting, bar coating, dip-coating). It is recently suggested that an organic semiconductor thin film may be formed at an expected position by using zone-casting or ink-jet printing, for example.

However, these methods may not provide an organic semiconductor thin film having electrical properties to an expected degree.

SUMMARY

Example embodiments relate to a method of manufacturing an organic thin film.

A method of manufacturing an organic semiconductor thin film according to example embodiments includes coating an organic semiconductor solution on a substrate, and shearing the organic semiconductor solution in a direction that results in fast evaporation rates and substantially constant velocity a shearing stress being applied to the organic semiconductor solution to form the organic semiconductor thin film, wherein a speed of the shearing and the temperature of the substrate is controlled such that an intermolecular distance of the organic semiconductor thin film is adjusted.

The speed of shearing may be controlled such that the intermolecular distance of the organic semiconductor thin film is reduced.

The speed of shearing may be in a range between about 0.01 mm/s to about 25 mm/s.

The method may further include mounting the substrate on a hot plate maintained at a substantially constant temperature, prior to the coating of the organic semiconductor solution.

The substantially constant temperature of the hot plate may be in a range between about 25° C. and about 250° C.

The shearing of the organic semiconductor solution may include contacting a shearing plate with the organic semiconductor solution, the shearing plate being positioned oblique to a surface of the substrate, and moving the shearing plate substantially parallel to the surface of the substrate.

The substrate may include at least one selected from silicon, sapphire, glass, quartz, plastic, paper, and a metal.

The method may further include providing a thermal oxide layer on a wafer including silicon on a surface of the substrate, prior to the coating of the organic semiconductor solution.

The shearing of the organic semiconductor solution may be performed by using a shearing plate, and the shearing plate may include at least one selected from silicon, sapphire, glass, quartz, and a metal.

The shearing plate may include a wafer including silicon, and a thermal oxide layer on the wafer.

The organic semiconductor solution may include an organic semiconductor material and a solvent, and the organic semiconductor material may include at least one of a π-conjugated monomeric semiconductor or a π-conjugated polymeric semiconductor.

The organic semiconductor material may include at least one selected from a soluble acene derivatives, tetrabenzoporphyrin, soluble oligo and poly (phenylenevinylene), soluble oligo and poly(thienylenevinylene), soluble oligo and polyfluorene, oligo and polythiophene, oligo and polythienothiophene, oligo and polyarylamine, soluble phthalocyanine derivatives, soluble metallo phthalocyanine derivatives, soluble perylene dicarboxlic diimide (PTCDI) derivatives, soluble naphthalendicarboxlic diimide (NTCDI) derivatives, perylene, coronene, poly(3-hexylthiophene (P3HT), triisopropylsilylethynyl pentacene (TIPS-pentacene), or derivatives thereof.

The organic solvent may include at least one selected from chlorobenzene, chloroform, toluene, benzene, tetrahydrofuran (THF), $CCl_4$, methylene chloride, decalin, tetralin, dichlorobenzene, xylene, trimethyl benzene, and ethyl acetate.

The organic semiconductor material may include 6,13-bis(triisopropylsilylethynyl)pentacene, and the solvent may include toluene.

The shearing speed may be between about 0.4 to about 8.0 mm/s.

The solvent may include a volatile solvent.

BRIEF DESCRIPTION OF THE DRAWINGS

Example embodiments will be more clearly understood from the following detailed description taken in conjunction with the accompanying drawings. FIGS. 1-20 represent non-limiting, example embodiments as described herein.

FIG. 1 is a schematic sectional view illustrating a method of manufacturing an organic semiconductor thin film according to example embodiments.

FIG. 2 is a chemical formula of an organic semiconductor according to example embodiments.

FIG. 3 is a schematic diagram of a shearing device used in a method of manufacturing an organic semiconductor thin film according to experimental examples.

FIG. 4 is a schematic sectional view of a substrate used in the method of manufacturing an organic semiconductor thin film according to experimental examples.

FIG. 5 is a schematic sectional view of a shearing plate used in the method of manufacturing an organic semiconductor thin film according to experimental examples.

FIG. 6 is an expanded diagram of a dotted portion VI shown in FIG. 3.

FIG. 7 is optical micrographs of samples of the TIPS-pentacene thin film formed according to experimental examples taken by using an optical microscope and a cross polarized optical microscope (CPOM).

FIG. 8 to FIG. 12 are CPOM images of organic thin films formed according to experimental examples.

FIG. 13 is photographs of GIXD patterns of TIPS-pentacene thin films according to comparative examples and experimental examples.

FIG. 14 shows a molecular packing structure of a TIPS-pentacene thin film formed by evaporation according to a comparative example.

FIG. 15 shows a molecular packing structure of a TIPS-pentacene thin film formed by shearing at a speed of about 8 mm/s according to an experimental example.

FIG. 16 shows a molecular packing structure of a TIPS-pentacene thin film formed by shearing at a speed of about 8 mm/s, viewed along the cofacial axis.

FIG. 17 is a graph showing (101) d-spacing and (010) d-spacing of a TIPS-pentacene thin film formed by shearing as a function of solution-shearing speed.

FIG. 18 is a schematic sectional view of an organic thin film transistor according example embodiments.

FIG. 19 is a table showing electrical characteristics of organic thin film transistors shown in FIG. 18.

FIG. 20 is a graph showing a source-drain current and a square root thereof of organic thin film transistors shown in FIG. 18 as a function of a gate voltage.

DETAILED DESCRIPTION

Figure 1:
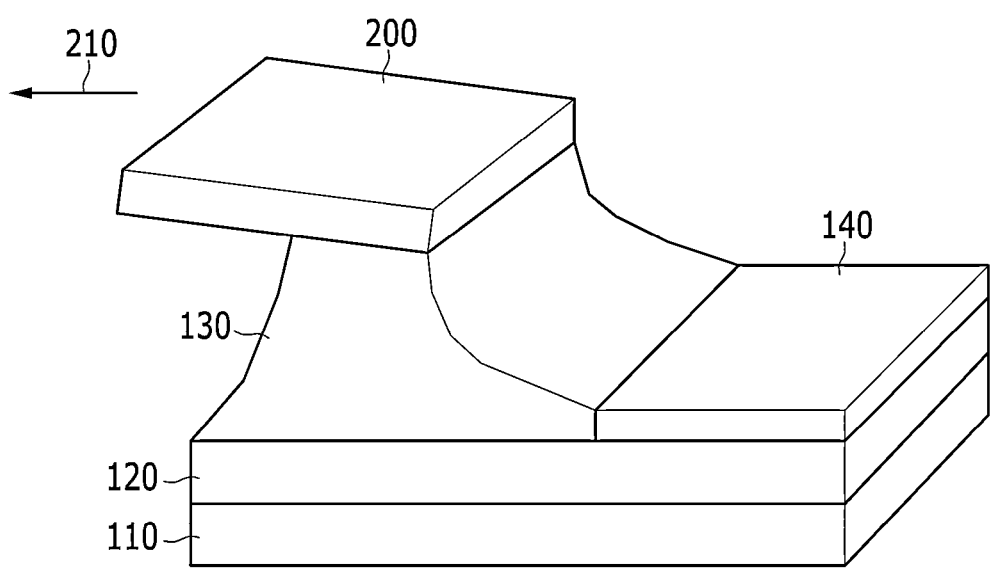

Various example embodiments will now be described more fully with reference to the accompanying drawings in which some example embodiments are shown. However, specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A method of manufacturing an organic semiconductor thin film according to example embodiments is described in detail with reference to FIG. 1 and FIG. 2.

Figure 2:
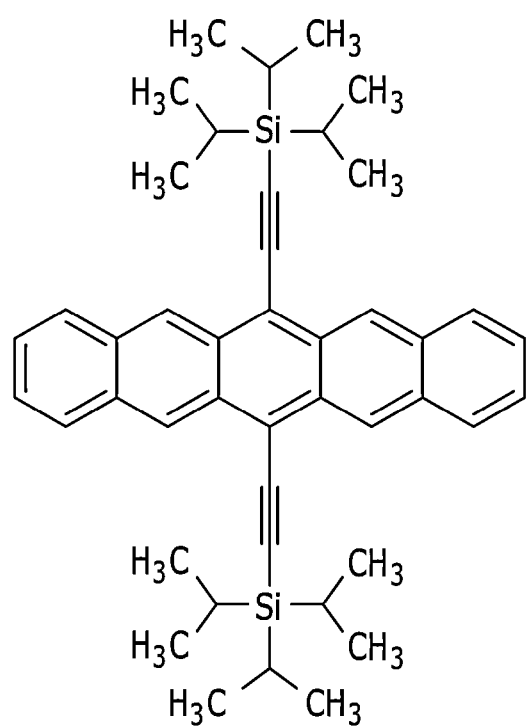

FIG. 1 is a schematic sectional view illustrating a method of manufacturing an organic semiconductor thin film according to example embodiments, and FIG. 2 is a chemical formula of an organic semiconductor according to example embodiments.

Referring to FIG. 1, a substrate 120 may be placed on a hot plate 110 according to example embodiments. The substrate 120 may include at least one of solids including silicon, sapphire, glass, quartz, a metal, and a polymer film. The hot plate 110 may be kept at a set temperature, for example, in a range between about 25° C. and about 250° C., which in turn keeps (or, maintains) the substrate 120 at substantially the same temperature. The set temperature may be changed depending on a material to be deposited on the substrate 120. The substrate 120 may be fixed to the hot plate 110.

Subsequently, an organic semiconductor solution 130 including a semiconductor material and a solvent is coated on at least a portion of the substrate 120.

The organic semiconductor material may include at least one of π-conjugated soluble oligomeric or polymeric semiconductors. In the case of large conjugated system, such as phthalocyanines, monomeric semiconductor may be used. Molecules with two-dimensional slip stacking packing motifs may be selected. Examples of π-conjugated monomeric or polymeric semiconductors may include a soluble acene derivatives, tetrabenzoporphyrin, soluble oligo and poly (phenylenevinylene), soluble oligo and poly (thienylenevinylene), soluble oligo and polyfluorene, oligo and polythiophene, oligo and polythienothiophene, oligo and polyarylamine, soluble phthalocyanine derivatives, soluble metallo phthalocyanine derivatives, soluble perylene dicarboxlic diimide (PTCDI) derivatives, soluble naphthalendicarboxlic diimide (NTCDI) derivatives, perylene, coronene, poly(3-hexylthiophene (P3HT), triisopropylsilylethynyl pentacene (TIPS-pentacene), or derivatives thereof. FIG. 2 shows 6,13-bis(triisopropylsilylethynyl)pentacene as an example.

The solvent may include an organic solvent that may dissolve the organic semiconductor material. According to example embodiments, the organic solvent may include at least one of chlorobenzene, chloroform, toluene, benzene, tetrahydrofuran (THF), $CCl_4$, methylene chloride, or ethyl acetate. The solvent may be volatile at a threshold temperature.

The organic semiconductor solution 130 may be comparatively weak, and for example, the organic semiconductor solution 130 may have a concentration of about 0.1 mg/ml to about 25 mg/ml.

Thereafter, a shearing plate 200 may be placed on the substrate 120 to cover the organic semiconductor solution 130 so that at least one portion of a lower surface of the shearing plate 200 may contact the organic semiconductor solution 130. At this time, the shearing plate 200 may be tilted with respect to the substrate 120. For example, the substrate 120 may be placed substantially parallel to a horizontal surface, and the shearing plate 200 may be placed at an oblique angle with respect to the horizontal surface. The shearing plate 200 may include at least one of solids including silicon, sapphire, glass, quartz, a metal, and a polymer film.

Next, the shearing plate 200 may be moved in a direction 210 and at a speed to expose the organic semiconductor solution 130, thereby forming an organic semiconductor thin film 140.

The direction 210 may be one of a plurality of directions that provides (or, applies) a velocity or a shearing stress to the organic semiconductor solution 130, and may be substantially parallel to an upper surface of the substrate 120.

The shearing speed may have a value that makes an intermolecular distance of the organic semiconductor thin film 140 adjust to an expected degree. The shearing speed may range from about 0.01 mm/s to about 50 mm/s, and may be determined based on a material. In other words, the intermolecular distance of the organic semiconductor thin film 140 may be varied depending on the moving speed of the shearing plate 200, and thus, the intermolecular distance of the organic semiconductor thin film 140 may be controlled by adjusting the moving speed of the shearing plate 200. For example, when the moving speed of the shearing plate 200 has a set value, the intermolecular distance of the organic semiconductor thin film 140 may become smaller than when the moving speed of the shearing plate 200 has another value. In addition, the moving speed of the shearing plate 200 has a set value, the field effect mobility of the organic semiconductor thin film 140 may become higher to improve electrical properties of the organic semiconductor thin film 140.

For example, the π-π stacking distance of TIPS-pentacene may decrease from a normal value of about 3.33 Å to about 3.08 Å when the moving speed of the shearing plate 200 increases to about 8 mm/s.

Next, a method of manufacturing an organic semiconductor thin film according to experimental examples is described in detail with reference to FIG. 3 to FIG. 6.

Figure 3:
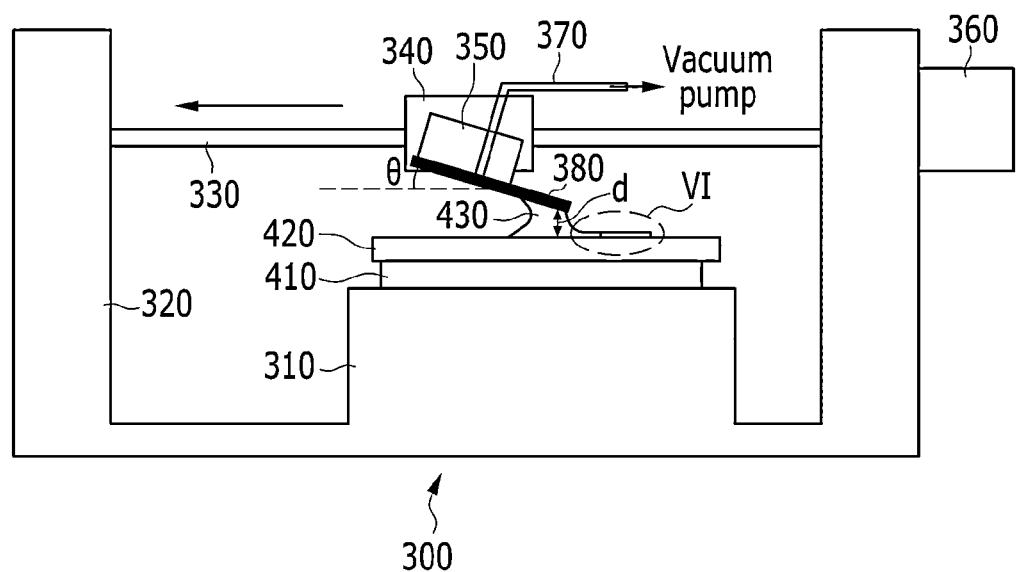
Figure 4:
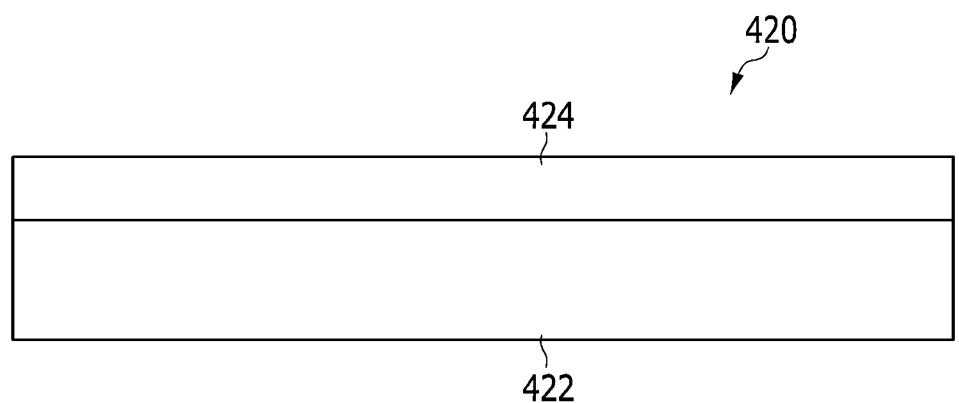
Figure 5:
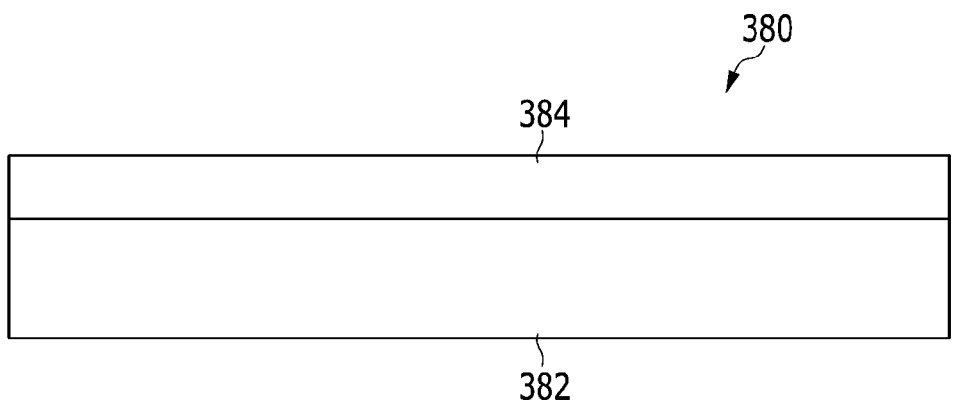
Figure 6:
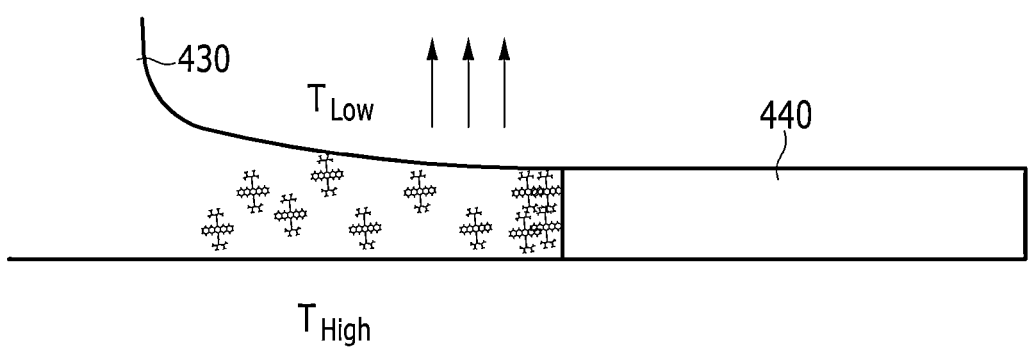

FIG. 3 is a schematic diagram of a shearing device used in a method of manufacturing an organic semiconductor thin film according to experimental examples, FIG. 4 is a schematic sectional view of a substrate used in the method of manufacturing an organic semiconductor thin film according to experimental examples, FIG. 5 is a schematic sectional view of a shearing plate used in the method of manufacturing an organic semiconductor thin film according to experimental examples, and FIG. 6 is an expanded diagram of a dotted portion VI shown in FIG. 3.

Referring to FIG. 3, a shearing device 300 used in experimental examples includes a stage 310, a pair of columns 320, a horizontal bar 330, a movable member 340, a rotating member 350, a motor 360, a vacuum tube 370, and a shearing plate or a shearing blade 380.

The stage 310 has a flat upper surface on which a substrate is placed, and may include a heating member (not shown) that may heat the substrate mounted on the upper surface.

A pair of columns 320 are disposed at both sides of the stage 310, and the horizontal bar 330 is connected between the columns 320. The movable member 340 is coupled to the horizontal bar 330 such that the movable member 340 may move along the horizontal bar 330 in a horizontal direction. The rotating member 350 is coupled to the movable member 340 such that the rotating member 350 may rotate around an axis that is substantially perpendicular to the horizontal bar 330 and substantially parallel to the upper surface of the stage 310. The shearing plate 380 is coupled to the rotating member 350 via the vacuum tube 370 connected to a vacuum pump (not shown).

A hot plate 410 is placed on the stage 310 of the shearing device 300, and a substrate 420 is fixed on the hot plate 410. Thereafter, an organic semiconductor solution 430 is coated on the substrate 420.

The substrate 420 includes a heavily doped n-type silicon wafer 422 (having resistivity smaller than about 0.005 Ωcm) and a thermal silicon oxide layer 424 having a thickness of about 300 nm. The thermal oxide layer 424 has a capacitance ($C_{ox}$) per unit area of about 10 nF/cm$^2$.

Before the substrate 420 is fixed on the hot plate 410, the substrate 420 is cleaned in a Piranha solution (70/30 vol./vol. $H_2SO_4/H_2O_2$, a highly oxidative solution) for about 25 minutes. Subsequently, the substrate 420 is treated with phenyltrichlorosilane (PTS) to ensure proper wetting for the organic semiconductor solution 430 and to reduce surface charge traps. PTS treatment is accomplished by immersing the substrate 420 into a toluene solution of PTS of about 3 wt % and heated at about 90° C. for about 15 hours. The substrate 420 is subsequently removed from the PTS solution and is sonicated for about 2 minutes in toluene. The substrate 420 is then gently wiped with a sponge tip and rinsed sequentially with toluene, acetone, and isopropanol. The water contact angle of the PTS treated surface of the substrate 420 ranges from about 72 degrees to about 74 degrees. The typical roughness (i.e., the root mean square of the surface roughness) is about 0.3 nm to about 0.5 nm.

Referring to FIG. 5, the shearing plate 380 includes a silicon wafer 382 and a thermal oxide layer 384 having a thickness of about 300 nm. The shearing plate 380 is treated with a monolayer of octadecyltrichlorosilane (OTS) so that the organic semiconductor solution 430 may not be deposited (or, remain) on the shearing plate 380. The water contact angle of the OTS modified surface of the shearing plate 380 ranges between about 102 degrees to about 104 degrees. The root mean square of the surface roughness ranges from about 0.2 nm to about 0.5 nm.

The organic semiconductor solution 430 includes TIPS-pentacene shown in FIG. 2 dissolved in toluene at a concentration of about 8 mg/ml. The TIPS-pentacene received from 3M is used without further purification.

The hot plate 410 is held at a temperature of about 90° C. while the substrate 420 is mounted on the hot plate 410.

After coating the organic semiconductor solution 430, the shearing plate 380 is lowered to make contact with the organic semiconductor solution 430. At this time, the substrate 420 is kept substantially parallel to a horizontal plane, and the shearing plate 380 is placed at a tilt angle θ of about 8 degrees from the horizontal plane. The distance d between a lower edge of the shearing plate 380 and an upper surface of the substrate 420 is fixed at about 100 μm.

At this state, the shearing plate 380 is moved horizontally at various velocities by the motor 360 to form an organic semiconductor thin film 440.

Referring to FIG. 6, molecules in the organic semiconductor solution 430 that were separated from the shearing plate 380 after the shearing plate 380 contacted the organic semiconductor solution 430 may evaporate from a surface of the organic semiconductor solution 430. Because the temperature $T_{Low}$ of the evaporating surface is lower than the temperature $T_{High}$ of a bottom surface of the organic semiconductor solution 430, the molecules in the organic semiconductor solution 430 may move toward the evaporating surface, and may be cooled down and crystallized to form the organic semiconductor thin film 440.

The substrate 420 coated with the resulting organic semiconductor thin film 440 is left on the hot plate 410 for about 2 minutes to about 3 minutes at about 90° C. to remove residual solvent.

The solution-sheared organic semiconductor thin film 440 was observed by using an optical microscope and a cross polarized optical microscope (Leica DM4000M), the result of which is described in detail with reference to FIG. 7 to FIG. 12.

Figure 7:
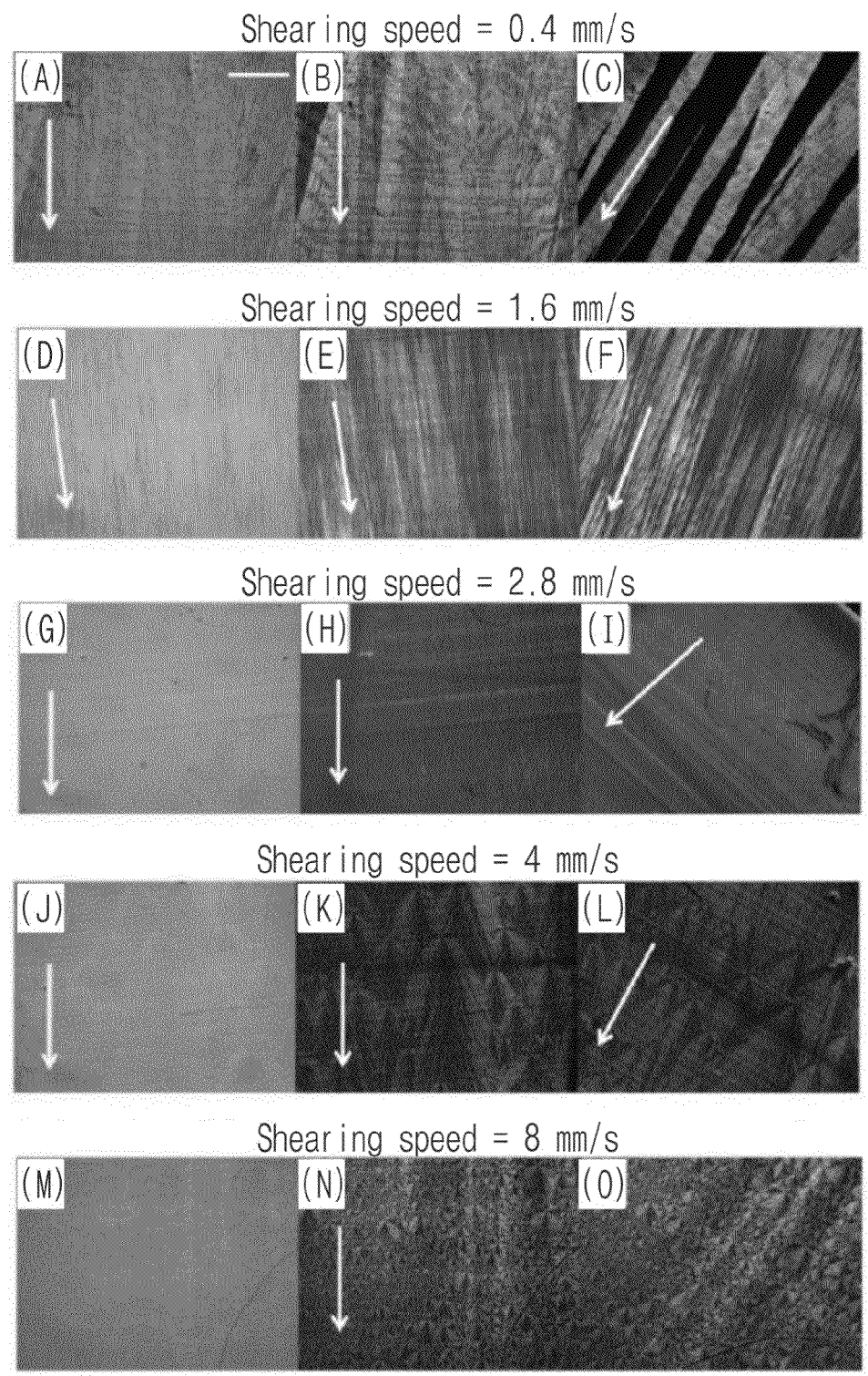

FIG. 7 is optical micrographs of samples of the TIPS-pentacene thin film formed according to experimental examples taken by using an optical microscope and a cross polarized optical microscope (CPOM), and FIG. 8 to FIG. 12 are CPOM images of organic thin films formed according to experimental examples.

(A), (D), (G), (J), and (M) of FIG. 7 are optical micrographs of organic thin films formed according to experimental examples taken by using an optical microscope when the shearing speed is about 0.4 mm/s, about 1.6 mm/s, about 2.8 mm/s, about 4 mm/s, and about 8 mm/s, respectively. (B), (E), (H), (K), and (N) are CPOM images of substantially the same regions as in (A), (D), (G), (J), and (M), respectively. (C), (F), (I), (L) and (O) are CPOM images of substantially the same regions as in (A), (D), (G), (J), and (M), respectively, with the samples rotated at an angle.

In FIG. 7, the white arrows represent the shearing directions, and the white scale bars have a length of about 1 mm. Dark regions of the images are due to domains oriented along the polarization direction of the light.

FIG. 8, FIG. 9, FIG. 10, FIG. 11, and FIG. 12 are other CPOM images of organic thin films formed by experimental examples when the shearing speed is about 0.4 mm/s, about 1.6 mm/s, about 2.8 mm/s, about 4 mm/s, and about 8 mm/s, respectively. In FIG. 8 to FIG. 12, the white arrows represent the shearing directions, and the white scale bars have a length of about 200 μm. Dark regions of the images are due to crystallites oriented along the polarization direction of the light Referring to FIG. 7 to FIG. 12, internal structures of the organic semiconductor thin films are different depending on the shearing speed.

Figure 8:
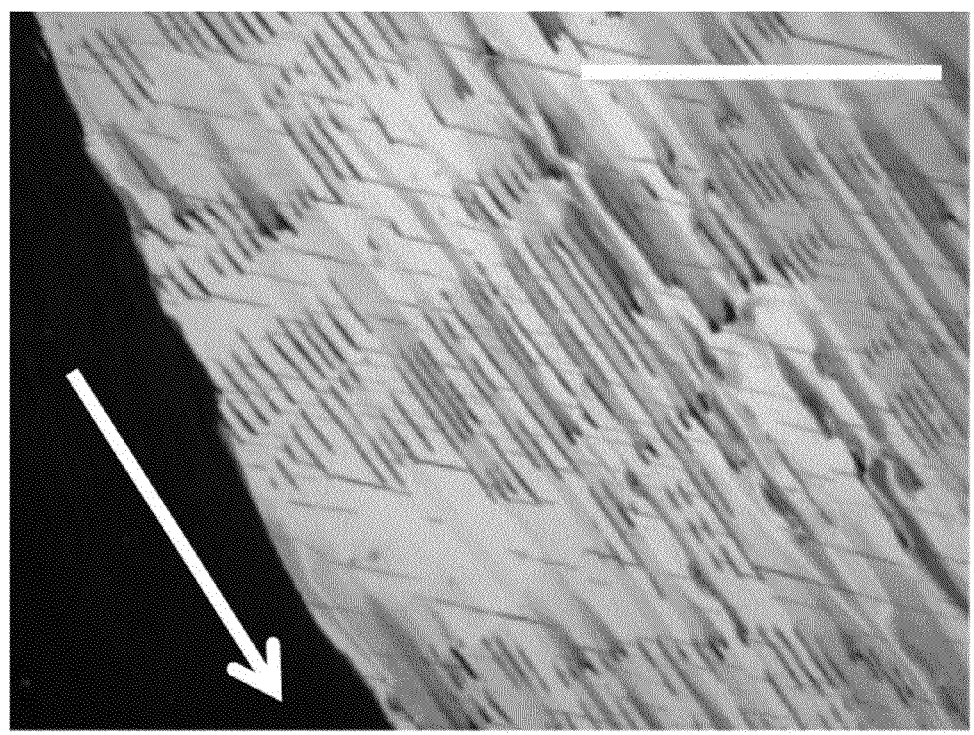

Referring to FIG. 8, for a shearing speed of about 0.4 mm/s, oriented, millimeter-wide domains with lengths of up to about a centimeter are observed with the long axis parallel to the shearing direction.

Figure 9:
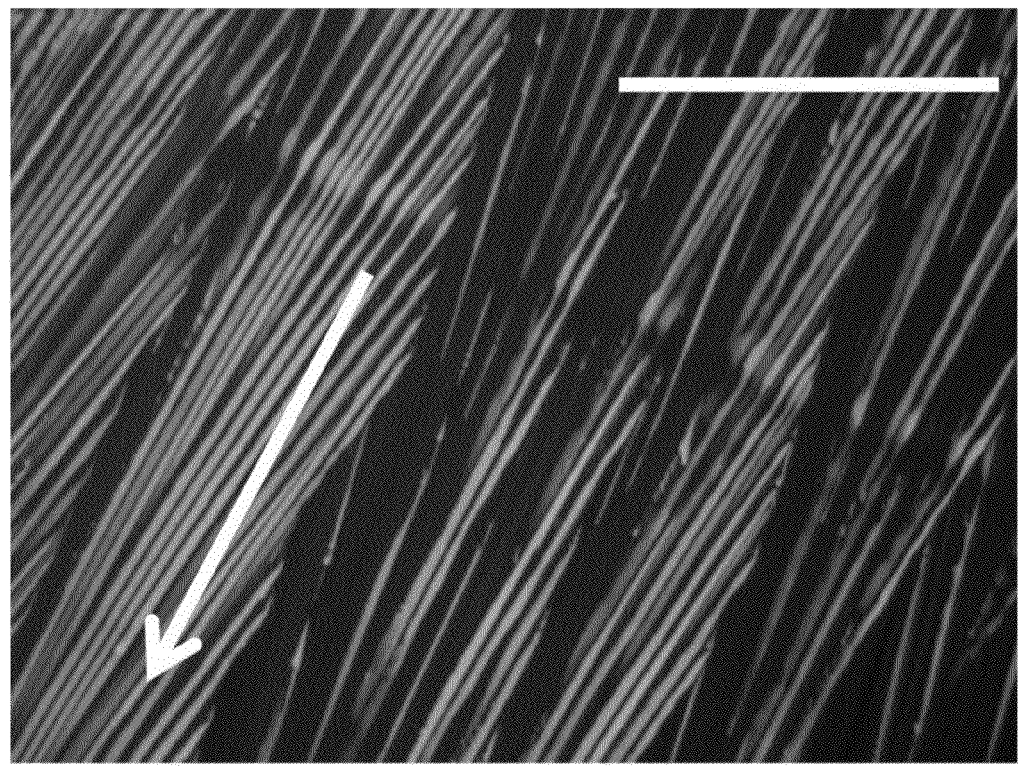
Figure 10:
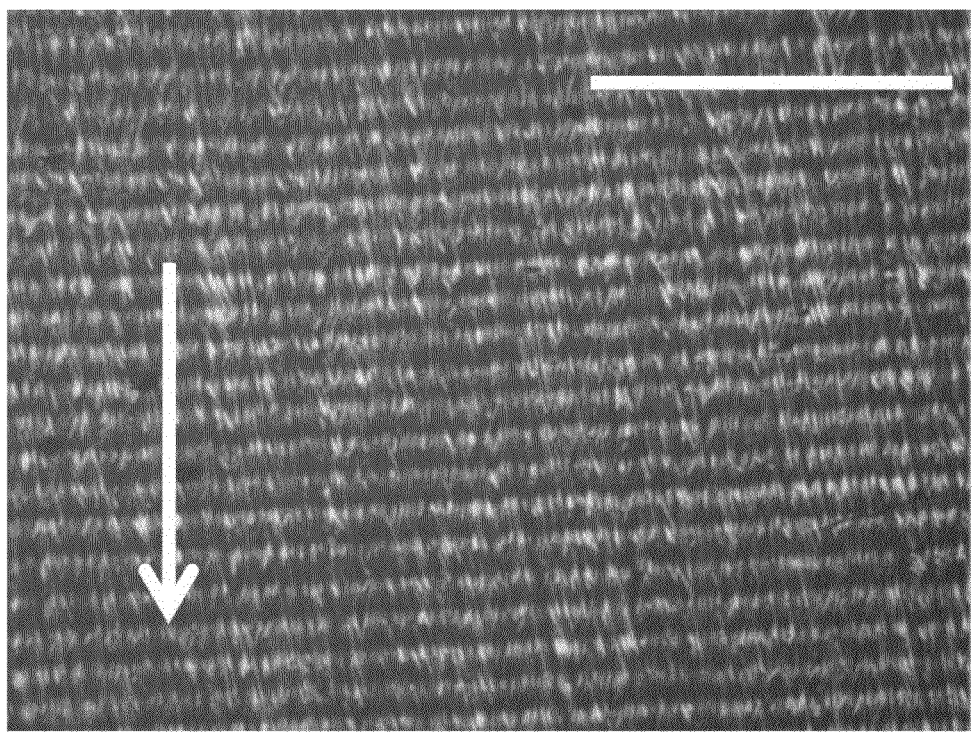

Referring to FIG. 9, shearing at a speed of about 1.6 mm/s results in domains that are narrower and shorter in length than those resulting from shearing at about 0.4 mm/s. This trend in the morphology of the organic semiconductor thin film continues up to a shearing speed of about 2.8 mm/s as shown in FIG. 10.

Figure 11:
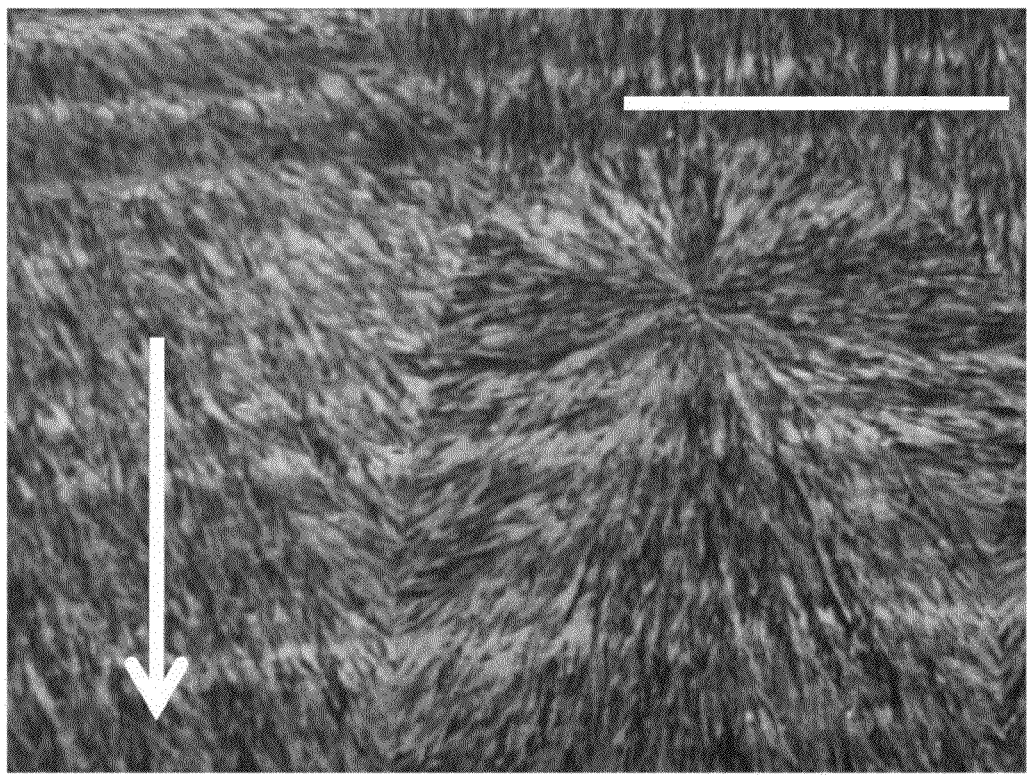

Referring to FIG. 11, when the shearing speed is raised to about 4 mm/s, a comet-shaped morphology (known as 'transcrystalline') is observed, and these features are hundreds of micrometers wide and several millimeters long.

Figure 12:
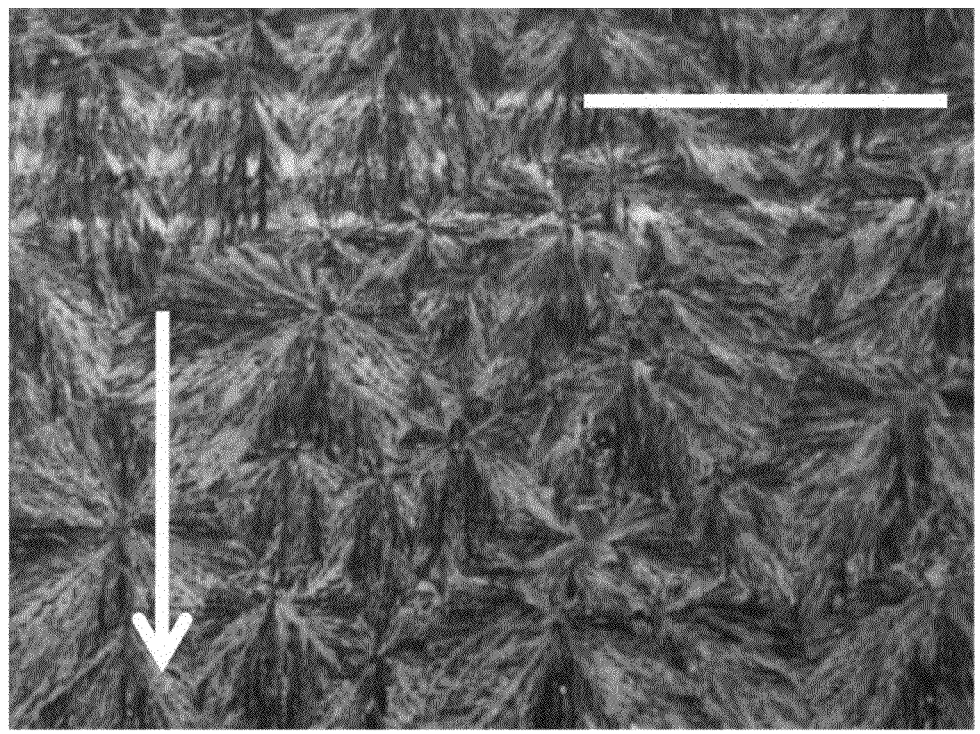

Referring to FIG. 12, increasing the shearing speed to about 8 mm/s results in an isotropic spherulitic film. No preferential orientation relative to the shearing direction is observed for the spherulites.

In addition to altering the crystallite orientation (texture) and domain sizes of the organic semiconductor thin film, solution-shearing speed also has an effect on the molecular packing in the thin film 440. Grazing incidence X-ray diffraction (GIXD) experiments are performed to observe the texture and molecular packing, the result of which is shown in FIG. 13.

Figure 13:
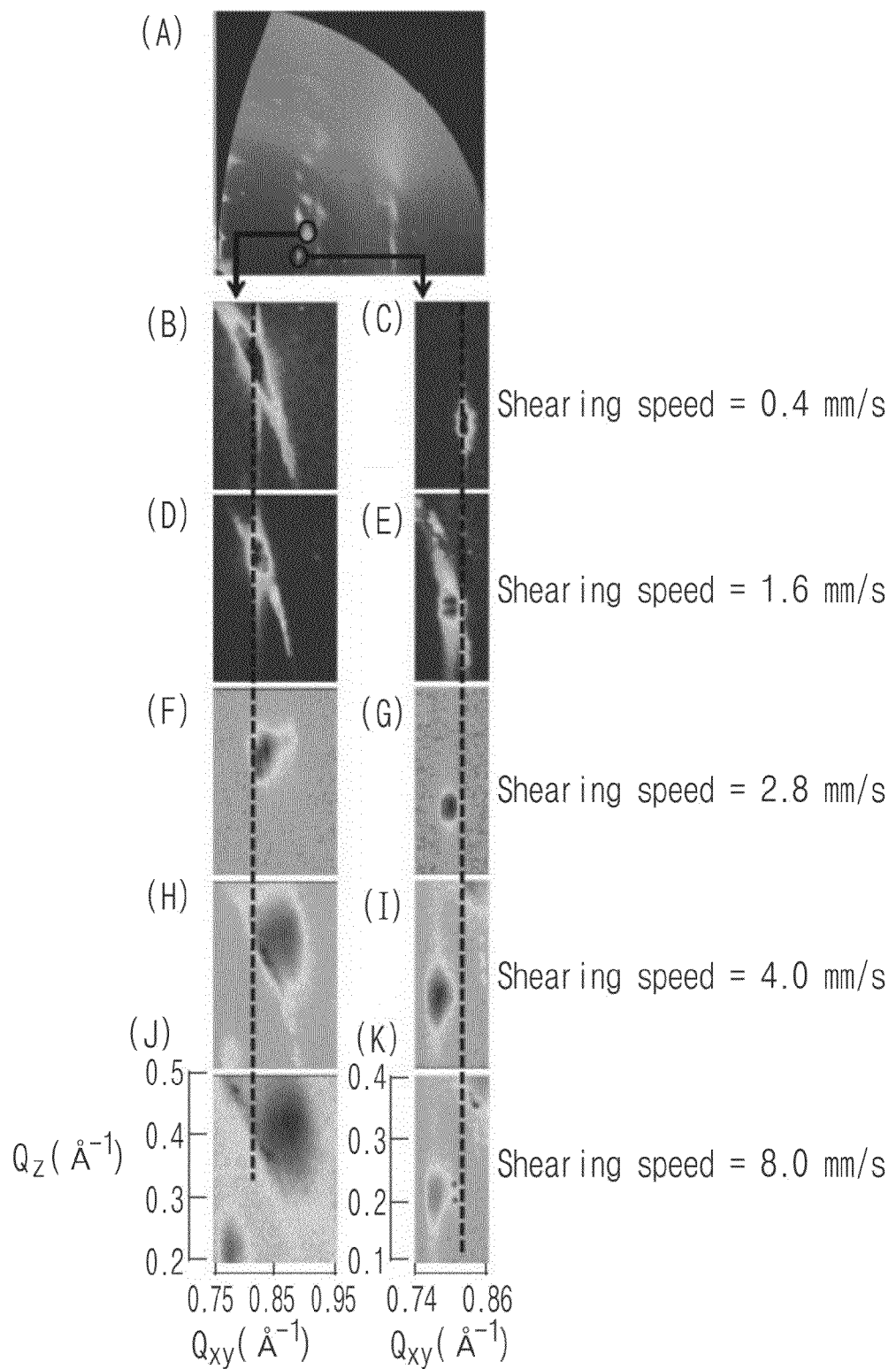

FIG. 13 is photographs of GIXD patterns of TIPS-pentacene thin films according to comparative examples and experimental examples.

(A) of FIG. 13 is a representative GIXD pattern of a TIPS-pentacene thin film formed as a representative example. (B), (D), (F), (H), and (J) are GIXD patterns of TIPS-pentacene thin films 440 when the shearing speed is about 0.4 mm/s, about 1.6 mm/s, about 2.8 mm/s, about 4 mm/s, and about 8 mm/s, respectively, showing the evolution of the (101) Bragg peak used to calculate the (101) d-spacing of the TIPS-pentacene thin films. (C), (E), (G), (I), and (K) are GIXD patterns of TIPS-pentacene thin films when the shearing speed is about 0.4 mm/s, about 1.6 mm/s, about 2.8 mm/s, about 4 mm/s, and about 8 mm/s, respectively, showing the evolution of the (010) Bragg peak used to calculate the (010) d-spacing of the organic semiconductor thin films. GIXD are performed at the Stanford Synchrotron Radiation Light source.

Referring to FIG. 13, as shearing speed increases, the (101) Bragg peak shifts to a higher reciprocal spacing $Q_{xy}$, and the (010) Bragg peak shifts to a lower reciprocal spacing $Q_{xy}$. Here, components $Q_{xy}$ and $Q_z$ are the scattering vectors parallel and perpendicular to the substrate 420, respectively. A dashed line is placed at unstrained peak positions.

In addition, the crystallinity may be the best when the shearing speed is about 2.8 mm/s.

Figure 14:
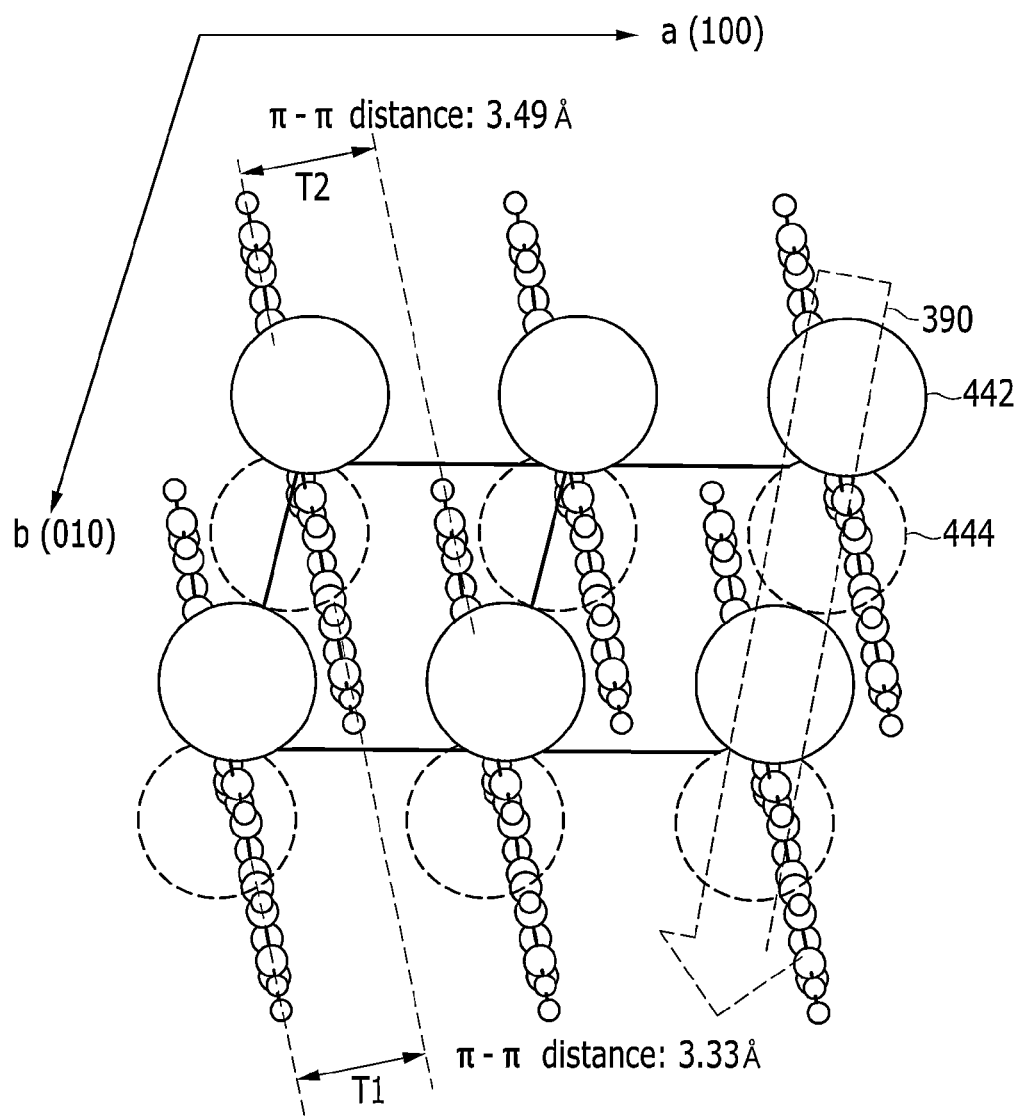
Figure 15:
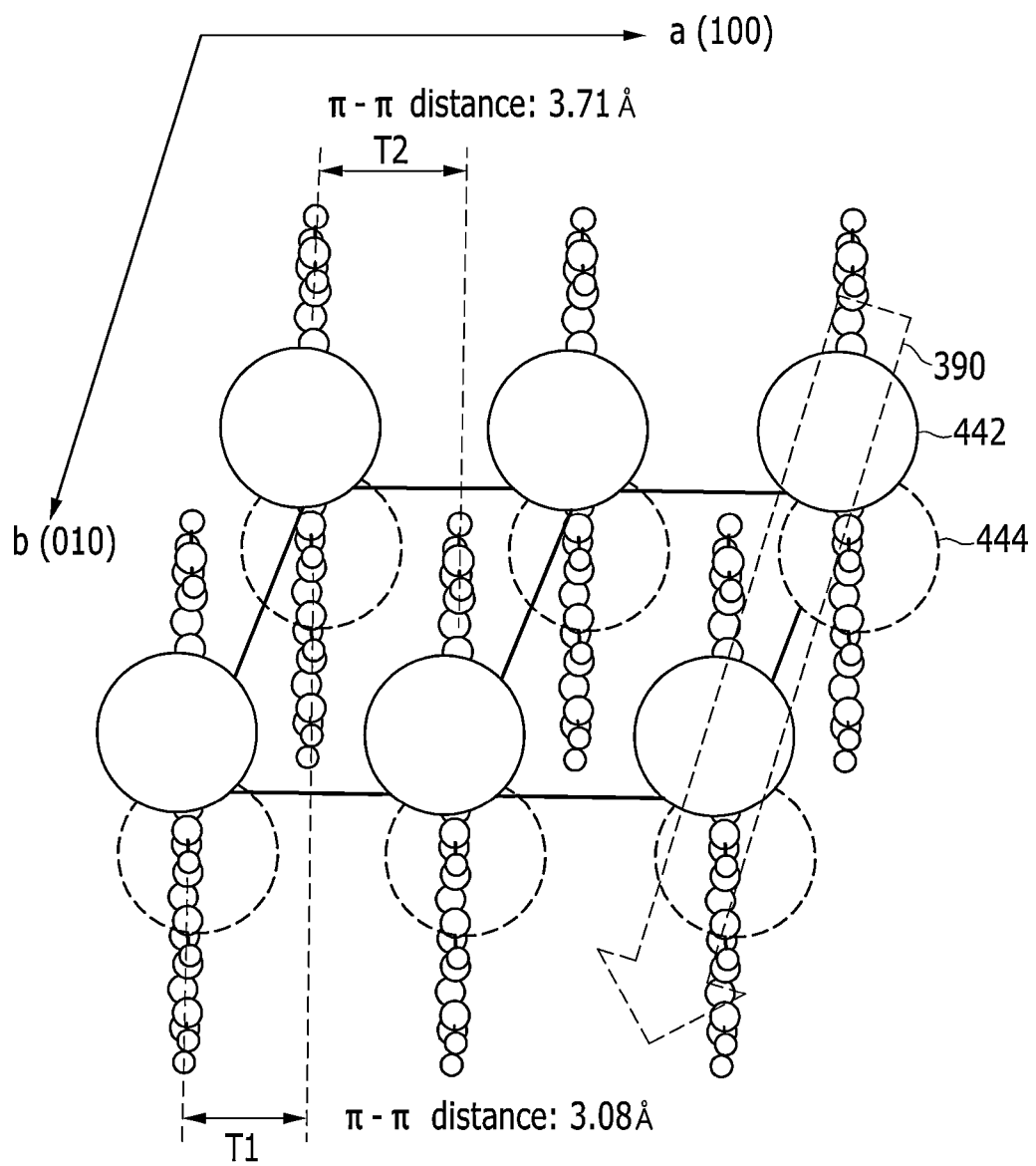
Figure 16:
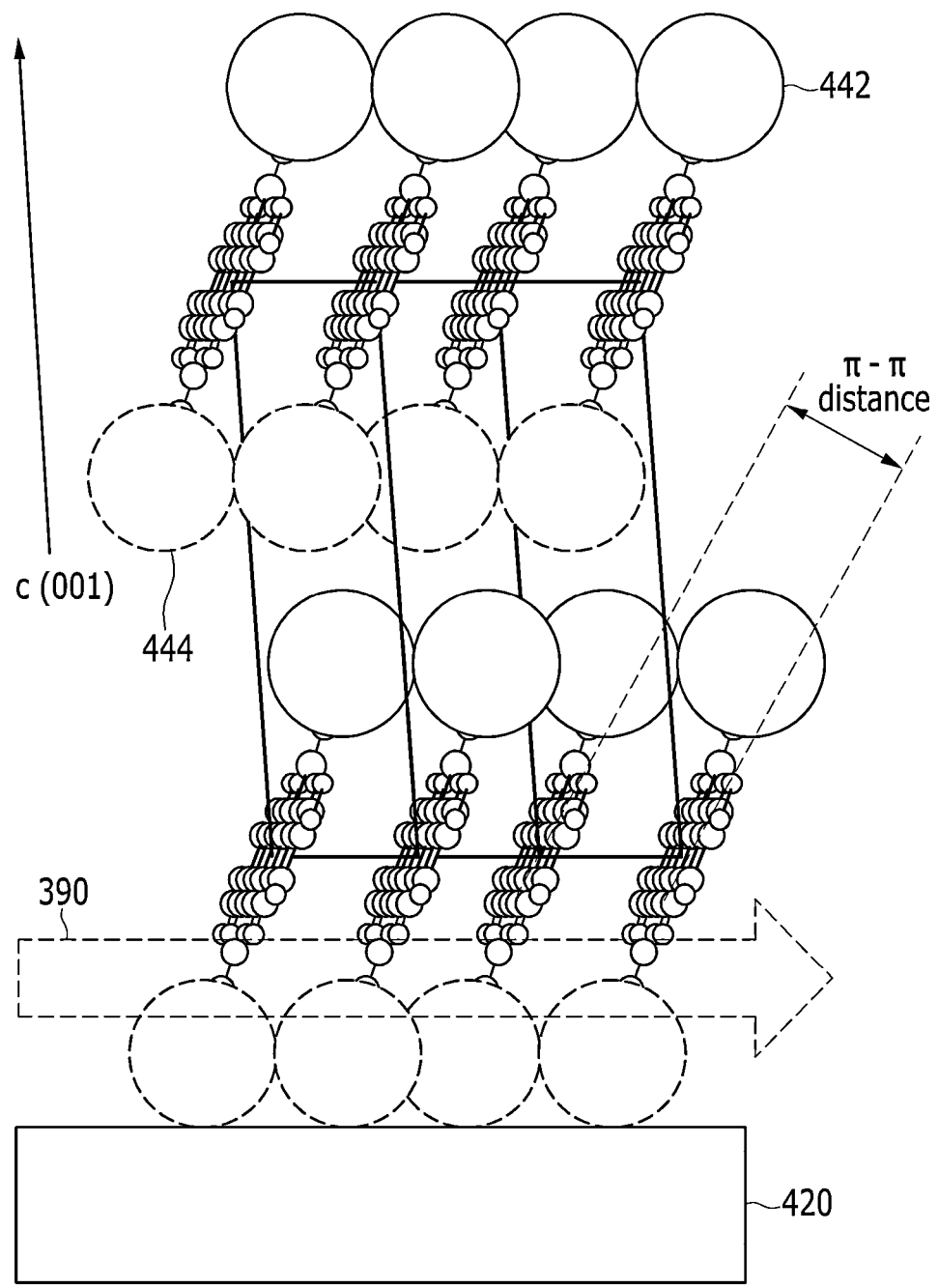

Molecular packing structures shown in FIG. 14 to FIG. 16 are obtained based on the GIXD pattern shown in FIG. 13.

FIG. 14 shows a molecular packing structure of a TIPS-pentacene thin film formed by evaporation according to a comparative example, FIG. 15 shows a molecular packing structure of a TIPS-pentacene thin film formed by shearing at a speed of about 8 mm/s according to an experimental example, and FIG. 16 shows a molecular packing structure of a TIPS-pentacene thin film formed by shearing at a speed of about 8 mm/s, viewed along the cofacial axis.

Spheres 442 and 444 may denote the TIPS groups, and solid spheres 442 and dotted spheres 444 may correspond to the front and back of the pentacene moiety, respectively. A wide arrow 390 denotes a high charge transport direction, as well as the direction of shearing. T1 and T2 denote the unique molecular pairs.

The molecular packing structures are obtained by performing numerical integration of the diffraction peak areas with the software WxDiff and by least-square-error optimization fitting of the peak positions to determine the unit cell geometries. The molecular arrangements of TIPS-pentacene in the unit cells are obtained from a crystallographic refinement procedure.

Referring to FIG. 14 and FIG. 15, the π-π stacking distance of the TIPS-pentacene thin film according to a comparative example is about 3.33 Å, and the π-π stacking distance according to an experimental example is decreased to about 3.08 Å

Figure 17:
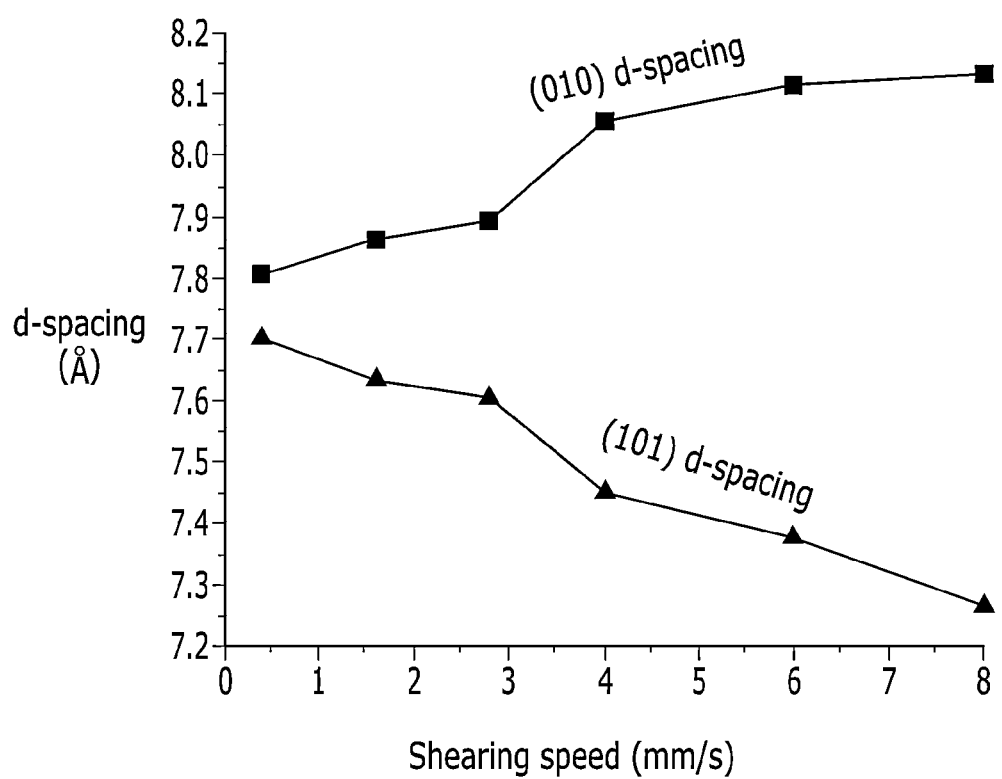

FIG. 17 shows (101) d-spacing and (010) d-spacing of a TIPS-pentacene thin film formed by shearing as a function of solution-shearing speed. As the shearing speed increases, the (101) d-spacing decreases, and concurrently the (010) d-spacing increases.

Next, an organic thin film transistor according example embodiments is described in detail with reference to FIG. 18.

Figure 18:
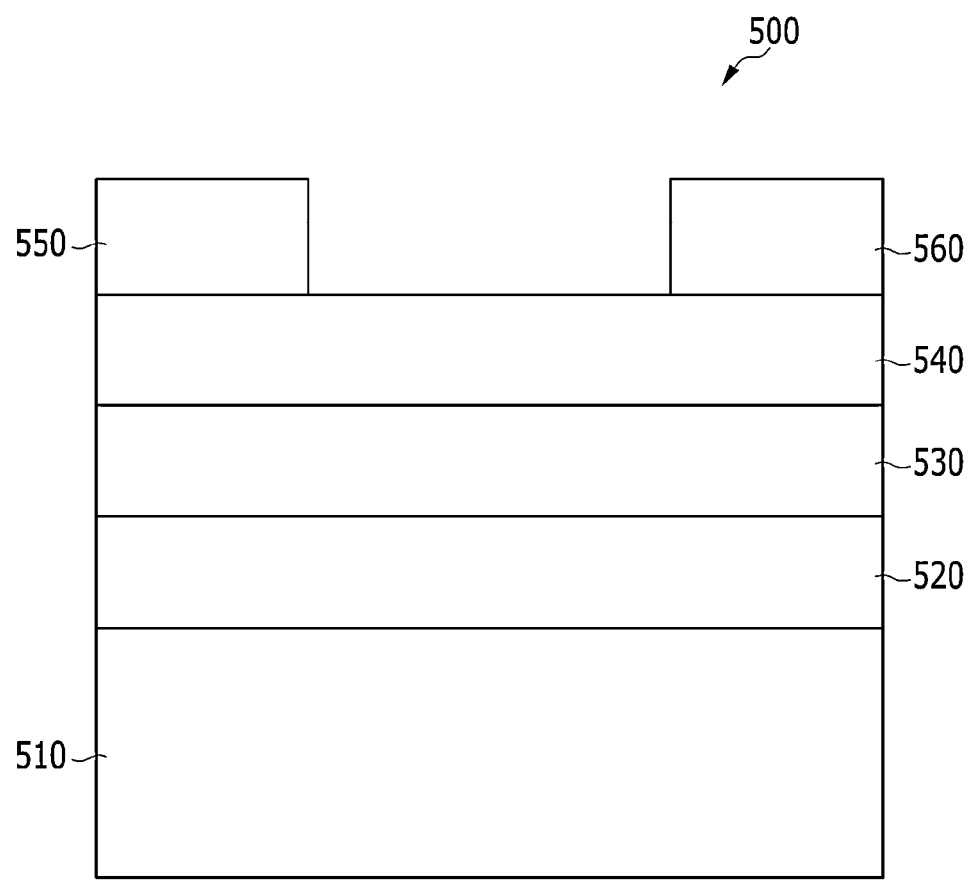

FIG. 18 is a schematic sectional view of an organic thin film transistor according example embodiments.

Referring to FIG. 18, an organic thin film transistor 500 according example embodiments may include a substrate 510, a gate electrode 520, a gate insulating layer 530, an organic semiconductor thin film 540, and source and drain electrodes 550 and 560.

The gate electrode 520, the gate insulating layer 530, and the organic semiconductor thin film 540 are sequentially deposited on the substrate 510, and the source electrode 550 and the drain electrode 560 are spaced apart from each other on the organic semiconductor thin film 540.

The organic semiconductor thin film 540 may be formed by a method similar to the above-described method of forming the organic semiconductor thin film 140.

Figure 20:
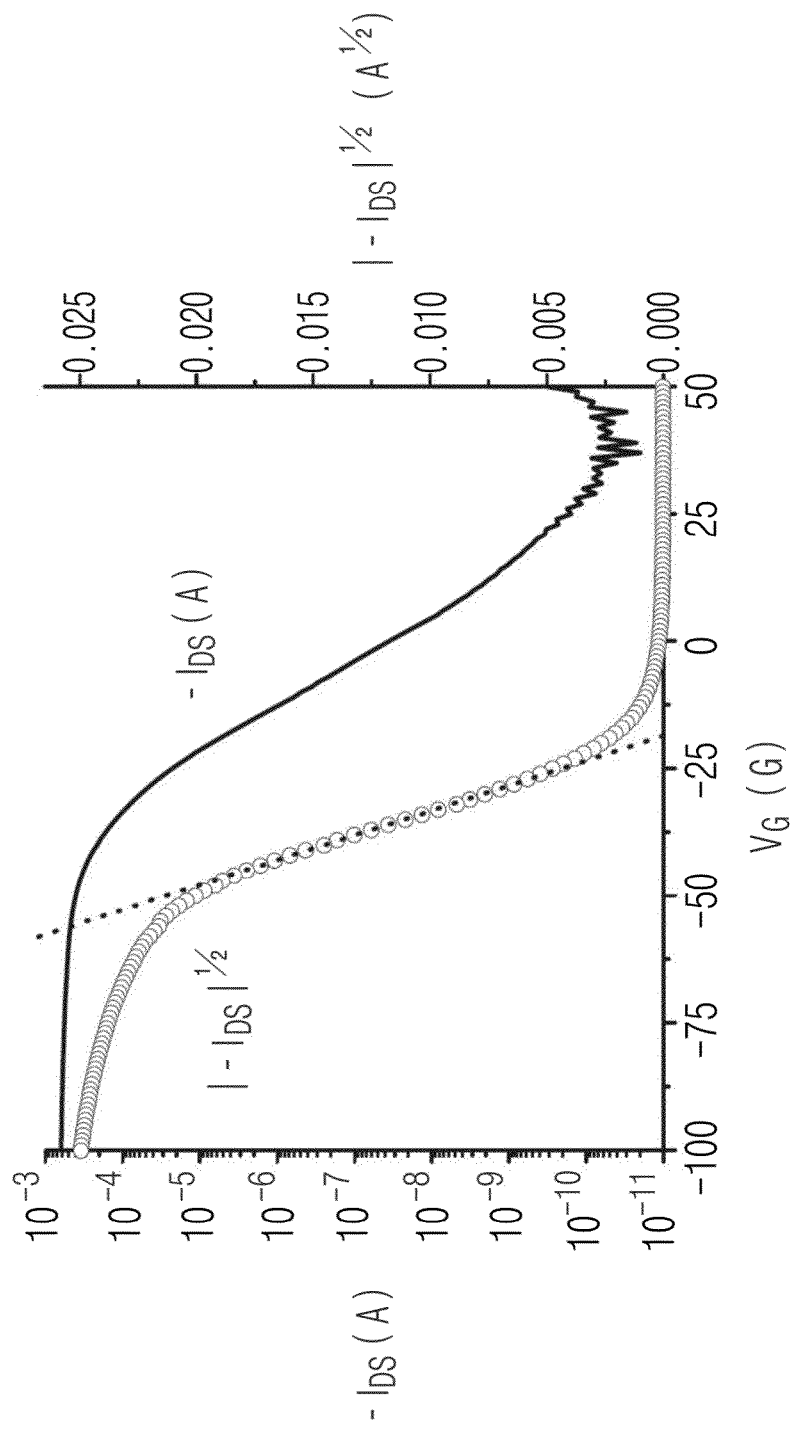

Organic thin film transistors shown in FIG. 18 according to experimental examples and comparative examples are manufactured and electrical properties are measured, which are shown in FIG. 19 and FIG. 20.

FIG. 19 is a table showing electrical characteristics of organic thin film transistors shown in FIG. 18, and FIG. 20 is a graph showing a source-drain current and a square root thereof of organic thin film transistors shown in FIG. 18 as a function of a gate voltage.

The source and drain electrodes have a thickness of about 40 nm, and are formed by thermal evaporation of gold (Au) using a shadow mask. The organic thin film transistors are fabricated and tested in ambient conditions, with exposure to light and air. The devices are stored in the dark under vacuum.

The organic semiconductor thin film according to the experimental examples is formed of TIPS-pentacene by the method as described above with reference to FIG. 3 and FIG. 6, while the organic semiconductor thin film according to the comparative examples is not sheared.

The electrical characteristics of the field effect transistor are measured along a shearing direction, using Keithley 4200-SCS semiconductor parameter analyzer.

Referring to FIG. 19, maximum and average mobility, average on-off ratio, average threshold voltage, average of maximum current, and standard deviation (St. Dev.) thereof are measured as a function of shearing speed. The on-off ratio represents the ratio between the maximum current in the organic thin film transistor when it is turned on, and the minimum current when organic thin film transistor is turned off. SEM (standard error of means) is defined as standard deviation divided by the square root of the number of samples. FIG. 19 also shows the number of samples used in the experiments for each shearing speed.

The maximum mobility of the organic semiconductor thin film is about 0.07 cm$^2$/Vs for the comparative examples without shearing, which is smaller than a value for the experimental examples. As the shearing speed increases, the maximum mobility roughly increases up to as high as about 4.59 cm$^2$/Vs at the speed of about 2.8 mm/s. The maximum mobility decreases again for the shearing speed over about 2.8 mm/s.

Referring to FIG. 20, the source-drain current ($I_{DS}$), as a transfer characteristic, of the organic thin film transistors prepared at a shearing speed of about 2.8 mm/s is measured as a function of a gate voltage ($V_G$). In addition, the source-drain current ($I_{DS}$), as an output characteristic, is measured as a function of a drain voltage ($V_D$) at various gate voltages ($V_G$).

The $I_{DS}$-$V_D$ curves are collected with the gate voltage ($V_G$) increasing from about −100 V to about 0 V and with the drain voltage ($V_D$) sweeping from about 0 V to about −100 V. The $I_{DS}$-$V_D$ curves are collected with the gate voltage ($V_G$) decreasing about 50 V to about −100 V at a constant drain voltage ($V_D$) of about −100 V. The saturation mobility (μ) is extracted from the slope of the transfer curve $V_G$-($I_{DS}$)1/2, where $I_{DS}$=μWC$_{ox}$($V_G$-$V_T$)$^2$/2 L. Here, a channel width denoted by W and a channel length denoted by L are about 1,000 μm and about 50 μm, respectively. C$_{ox}$ is the capacitance of the gate insulating layer per unit area, and V$_T$ is the threshold voltage.

As described above, a manufacturing method according to example embodiments may reduce the intermolecular distance to improve electrical characteristics.

While some example embodiments have been particularly shown and described, it will be understood by one of ordinary skill in the art that variations in form and detail may be made therein without departing from the spirit and scope of the claims.

DESCRIPTION OF SYMBOLS 110, 410: hot plate
120, 420: substrate
130, 430: organic semiconductor solution
140, 440: organic semiconductor thin film
200, 380: shearing plate
300: shearing device
310: stage
320: column
330: horizontal bar
340: movable member
350: rotating member
360: motor
370: vacuum tube
500: organic thin film transistor
510: substrate
520: gate electrode
530: gate insulating layer
540: organic semiconductor thin film
550, 560: source and drain electrodes

What is claimed is:
1. A method of manufacturing an organic semiconductor thin film, the method comprising:

coating an organic semiconductor solution on a substrate; and shearing the organic semiconductor solution in a direction that results in a shearing stress being applied to the organic semiconductor solution to form the organic semiconductor thin film, wherein a speed of the shearing is controlled such that an intermolecular distance of the organic semiconductor solution is adjusted.

2. The method of claim 1, wherein the speed of the shearing is controlled such that the intermolecular distance of the organic semiconductor solution is reduced.

3. The method of claim 2, further comprising:
mounting the substrate on a hot plate maintained at a substantially constant temperature, prior to the coating of the organic semiconductor solution.

4. The method of claim 3, wherein the substantially constant temperature of the hot plate is in a range between about 25° C. and about 250° C.

5. The method of claim 2, wherein the shearing of the organic semiconductor solution includes,
contacting a shearing plate with the organic semiconductor solution, the shearing plate being oblique to a surface of the substrate, and
moving the shearing plate substantially parallel to the surface of the substrate.

6. The method of claim 2, wherein the substrate includes at least one selected from silicon, sapphire, glass, quartz and a metal.

7. The method of claim 6, further comprising:
providing a thermal oxide layer on a wafer including silicon on a surface of the substrate, prior to the coating of the organic semiconductor solution.

8. The method of claim 2, wherein the shearing of the organic semiconductor solution is performed by using a shearing plate, and
the shearing plate includes at least one selected from silicon, sapphire, glass, quartz, and a metal.

9. The method of claim 8, wherein the shearing plate includes,
a wafer including silicon, and
a thermal oxide layer on the wafer.

10. The method of claim 2, wherein the organic semiconductor solution includes an organic semiconductor material and a solvent, and
the organic semiconductor material includes at least one of a π-conjugated monomeric semiconductor or a π-conjugated polymeric semiconductor.

11. The method of claim 10, wherein the organic semiconductor material includes at least one selected from pentacene, tetrabenzoporphyrin, phenylenevinylene, thienylenevinylene, fluorene, fullerene, polythiophene, polythienothiophene, polyarylamine, phthalocyanine, metal phthalocyanine, perylenetetracarboxylic dianhydride (PTCDA), naphthalenetetracarboxylic dianhydride (NTCDA), perylene, coronene, poly(3-hexylthiophene (P3HT), triisopropylsilylethynyl pentacene (TIPS-pentacene), phenyl-C61-butyric acid methyl ester (PCBM), and derivatives thereof.

12. The method of claim 11, wherein the solvent includes at least one selected from chlorobenzene, chloroform, toluene, benzene, tetrahydrofuran (THF), CCl4, methylene chloride, and ethyl acetate.

13. The method of claim 10, wherein the organic semiconductor material includes 6,13-bis(triisopropylsilylethynyl) pentacene, and
the solvent includes toluene.

14. The method of claim 13, wherein the speed of shearing is about from about 0.4 mm/s to about 8.0 mm/s.

15. The method of claim 10, wherein the solvent includes a volatile solvent.

16. The method of claim 1, wherein the speed of the shearing is in a range between about 0.01 mm/s to about 50 mm/s.

* * * * *